(12) United States Patent
Hines et al.

(10) Patent No.: US 7,791,249 B2
(45) Date of Patent: Sep. 7, 2010

(54) FREQUENCY CODED SENSORS INCORPORATING TAPERS

(76) Inventors: Jacqueline H. Hines, 1718 Winchester Rd., Annapolis, MD (US) 21409; Leland P. Solie, 2298 10 1/2 Ave., Chetek, WI (US) 54728

(*) Notice: Subject to any disclaimer, the term of this patent is extended or adjusted under 35 U.S.C. 154(b) by 296 days.

(21) Appl. No.: 11/768,428

(22) Filed: Jun. 26, 2007

(65) Prior Publication Data

US 2007/0296305 A1 Dec. 27, 2007

Related U.S. Application Data

(60) Provisional application No. 60/816,578, filed on Jun. 26, 2006.

(51) Int. Cl.
*H01L 41/04* (2006.01)
(52) U.S. Cl. .................. 310/313 B; 310/313 R
(58) Field of Classification Search ............ 310/313 R, 310/313 A, 313 B, 313 C, 313 D
See application file for complete search history.

(56) References Cited

U.S. PATENT DOCUMENTS

| 4,312,228 | A |   | 1/1982  | Wohltjen         |          |
|-----------|---|---|---------|------------------|----------|
| 4,734,698 | A | * | 3/1988  | Nysen et al.     | 342/44   |
| 5,691,698 | A | * | 11/1997 | Scholl et al.    | 340/572.5|
| 5,831,494 | A | * | 11/1998 | Solie            | 333/193  |
| 2004/0169570 | A1 | * | 9/2004 | Yip et al.      | 333/195  |

OTHER PUBLICATIONS

A review of Wireless SAW Sensors—Alfred Pohl, Member, IEEE (Invited Paper) IEEE Transactions On Ultrasonics, Ferroelectrics, And Frequency Control, vol. 47, No. 2, Mar. 2000 pp. 317-332.
Orthogonal Frequency Coding for SAW Device Applications—Gallagher et al -2004 IEEE Ultrasonics Symposium Ferroelectrics, and Frequency Control Joint 50th Anniversary Conference pp. 1082-1085.
Sandra Report—Passive Microwave Tags—Robert W. Brocato—Sandia National Laboratories—SAND2004-4924 Unlimited Release Printed Oct. 2004—pp. 1-29.

* cited by examiner

*Primary Examiner*—Walter Benson
*Assistant Examiner*—Derek J Rosenau
(74) *Attorney, Agent, or Firm*—Schiff Hardin LLP

(57) ABSTRACT

A surface acoustic wave device includes a piezoelectric substrate on which is formed a transducer that generates acoustic waves on the surface of the substrate from electrical waves received by the transducer. The waves are carried along an acoustic track to either a second transducer or a reflector. The transducers or transducer and reflector are formed of subsections that are constructed to operate at mutually different frequencies. The subsections of at least one of the transducers or transducer and reflector are out of alignment with respect to one another relative to the transverse of the propagation direction. The out of aligned subsections provide not only a frequency component but also a time to the signal output signal. Frequency response characteristics are improved. An alternative embodiment provides that the transducers and/or reflectors are continuously tapered instead of having discrete frequency subsections.

11 Claims, 12 Drawing Sheets

FREQUENCY CODED SENSORS INCORPORATING TAPERS

CROSS REFERENCE TO RELATED APPLICATION

This application claims the benefit U.S. provisional application No. 60/816,578 filed on Jun. 26, 2006, incorporated by reference herein.

STATEMENT REGARDING FEDERALLY SPONSORED RESEARCH OR DEVELOPMENT

This invention was made with Government support under Contract NNK05OB31C awarded by NASA. The Government has certain rights in this invention.

FIELD OF THE INVENTION

The present invention relates generally to sensors using surface acoustic wave technology and in particular to apparatus, systems, devices, and methods for frequency coding sensors using surface acoustic wave and sensors for transmission of sensor identification and information using surface acoustic wave elements and multiple acoustic tracks.

BACKGROUND AND BRIEF DESCRIPTION OF THE RELATED ART

Surface acoustic wave (SAW) sensors, initially developed in the mid 1980's can be used to measure physical, chemical, and biological parameters. See, for example, U.S. Pat. No. 4,312,228 "Methods of Detection With Surface Acoustic Wave and Aparati Therefor", by H. Wohltjen. These devices can be operated in wired or wireless modes. When operated wirelessly, SAW sensors have the advantage over many other wireless sensor technologies of being capable of use in a completely passive operation.

Systems using SAW devices for remote identification (or "tagging") generally include multiple passive SAW devices, each containing a unique identification code built into the device structure, and a remotely located interrogator which can generate a radio frequency (RF) interrogation signal, analyze the response reflected from the SAW device, and thereby determine the code and identify the specific device. Such SAW tagging systems have been used for access control applications, such as automotive tags for toll booth access, since the 1990's. See the publication by A. Pohl, "A review of Wireless SAW Sensors", *IEEE Transactions on Ultrasonics, Ferroelectrics, and Frequency Control*", Vol. 47, No. 2, pp. 317-332, March 2000.

Until relatively recently, SAW sensing and tagging have been regarded primarily as separate objectives. SAW tag devices were used principally for passive wireless identification purposes, as one type of radio frequency identification (RFID) device. The general goal of RFID technology has been to replace optically readable bar codes with identification devices that can be read remotely (and while covered) using RF signals. SAW sensors, by comparison, were used most extensively for detection, identification, and quantification of volatile chemical vapors. Systems using SAW sensors for gas identification relied on complex electronics to evaluate the responses produced by arrays of SAW sensors incorporating various chemically selective coatings. These applications invariably used wired configurations for the SAW sensors. In the past decade, SAW sensor researchers recognized the desirability of combining SAW sensing and SAW tagging, and a new goal of passive, remote, RF-interrogable SAW "sensor-tags" was identified. Passive remote tag sensing using SAW devices will produce a system that is capable of identifying and tracking individual sensors in an environment in which there are several sensors within the range of the interrogator by using a built-in code or ID in each sensor. These passive sensor tags will enable remote measurement of individually identifiable sensor responses, providing both sensor identification and sensor measurement information in the passively reflected RF signal.

In his 2000 review paper on wireless SAW sensing (A. Pohl, "A review of Wireless SAW Sensors", *IEEE Transactions on Ultrasonics, Ferroelectrics, and Frequency Control*", Vol. 47, No. 2, pp. 317-332 March 2000), Alfred Pohl discusses the types of SAW devices used (delay lines and resonators) and the types of multiple access communication systems used to allow individually identifiable sensors. The approaches discussed include space division multiple access (SDMA) and time division multiple access (TDMA) for delay line devices, and frequency diversity for high-Q resonators. This summary paper also discussed the two methods for employing SAW devices wirelessly in sensing applications: (1) Using SAW one-port devices that are directly affected by the measurand as the sensor; and (2) Using two-port SAW devices that have one port electrically loaded by a conventional sensor affected by the measurand.

In 2004, Robert Brocato and his research team at Sandia National Labs discussed another technique for achieving passive remote tag sensing. See the Sandia Report SAND2004-4924 by Robert Brocato. This spread spectrum approach used SAW correlators to provide a built-in code in the SAW device.

In 2004, Don Malocha at the University of Central Florida introduced another coding scheme for producing uniquely identifiable SAW sensors, Orthogonal Frequency Coding (OFC). See the publication D. C. Malocha et. al., "Orthogonal Frequency Coding for SAW Device Applications", *Proceedings of the 2004 IEEE Ultrasonics Symposium*. This spread spectrum approach to device coding requires that the SAW device consist of an input transducer and multiple reflective structures (reflector chips) with frequency responses spanning the selected wideband spectrum. These reflective structures are required to have properties that meet the orthogonality conditions that define orthogonal frequency coding. These orthogonality conditions impose strict mathematical relationships between the local (or basis set) frequencies and bandwidths of the reflector chips. The orthogonality conditions defining OFC produce reflector responses that are discrete in the time domain (rectangular [rect] functions in time, each with a specific carrier frequency sinusoid) and overlapping in the frequency domain (sin(x)/x responses with the peak of each chip frequency response occurring at the first nulls of the two adjacent chip frequency responses). The in-line configurations of the OFC devices described by Malocha also place strict limitations on the maximum possible time length of adjacent reflector chips. The imposition of the mathematical orthogonality conditions defined by Malocha results in unavoidable problems with interference between chip reflections, which causes the practical implementation of codesets with multiple codes that work together to provide unique sensor identification to be difficult. In fact, the orthogonality conditions force an unacceptable degree of spectral overlap between adjacent frequency chips. In addition, the spatial limitations introduced by the single track configuration described by Malocha severely limit the realizable efficiency of the reflector chips, causing unnecessarily high chip reflection losses. The single track approach also forces the acoustic wave to pass under reflector regions of varying frequencies. This factor, taken together with the spectral overlap of the chips, results in reflective losses from the wave that degrade the overall device response and make the response strongly code dependent.

As spread spectrum approaches, both SAW correlator sensors and OFC sensors benefit from the inherent advantages of processing gain obtained by increasing the time-bandwidth product over the data bandwidth. These techniques also benefit from communication security and reliability (resistance to jamming) inherent in spread spectrum communication systems.

Prior SAW tag-sensors utilizing OFC for coding suffer from significant difficulties in achieving adequate device performance. The present invention overcomes these limitations and provides for specific advantages over the prior art.

SUMMARY OF THE INVENTION

The present invention relates to devices and methods for coding SAW sensors using discrete frequency coding (DFC). Specifically, the invention relates to a SAW coding technique for transmission of sensor identification and information using tapered SAW elements and multiple acoustic tracks.

Unlike prior OFC SAW (orthogonal frequency coded surface acoustic wave) sensors, the devices according to the invention utilize tapered, step tapered, or slanted transducers and reflector elements spatially distributed across the SAW die in multiple acoustic tracks to implement reflector chip frequency sub-channels that are discrete in the frequency domain. The devices according to the invention purposefully violate the orthogonality conditions that define orthogonal frequency coding (OFC) and instead are designed to provide discrete chip frequency responses that interfere less with each other than OFC chips, in order to achieve specific performance advantages over OFC approaches.

DETAILED DESCRIPTION OF THE PREFERRED EMBODIMENTS

The sensors of embodiments of the current invention utilize two fundamentally different elements to realize advantages over prior art coding techniques. First, sensor embodiments utilize spatial diversity to overcome the limitations introduced in the single-track OFC device approach taught in the prior art publication of Malocha. Second, tapered transducer and reflector elements are utilized to efficiently spread the broadband input energy across the sensor die without losses due to power division, and to generate reflector chip responses that are discrete in the frequency domain. The implementation and benefits of each of these elements is described briefly below.

Spatial diversity is achieved in these embodiments by using multiple acoustic tracks, separated spatially on the surface of the device in a direction transverse to the acoustic wave propagation direction. This approach allows separation of the frequency channels (or "chips") so that an acoustic wave in each chip frequency range can propagate in its own channel on the crystal, and interact only with the appropriate frequency region in the other transducer and reflector elements. This overcomes several recognized problems with OFC devices. First, the frequency content of adjacent chips in OFC devices do have significant spectral overlap in the frequency domain. Therefore, if a wave corresponding to a chip at one frequency passes under a reflector chip of an adjacent band in a conventional OFC device, a certain amount of energy will be reflected by that adjacent band reflector. This results in OFC devices that have chip amplitudes that are code-dependent. Spatial diversity using multiple acoustic channels can alleviate this problem, both for devices coded with conventional OFC techniques, and for DFC coded devices. Second, spatial diversity using multiple acoustic channels eliminates the problem of amplitude variation with chip position encountered in conventional single-track OFC devices.

In OFC devices as taught by the prior art publication of Malocha, there is a practical limitation on the number of chips that can be used in one row, due to reflective losses caused by wave energy scattering into the bulk and reflecting from previous reflector chips. These effects cause the last chip in a reflector bank to have a lower reflected signal than the first chip in the bank. This falloff in reflected response amplitude with sequential chips effectively limits the number of chips that can be used in conventional OFC devices. This problem is avoided completely both for devices coded with conventional OFC techniques, and for DFC coded devices using multiple acoustic channels. Third, the orthogonality conditions imposed in conventional single track OFC device design define limited spatial relationships between the individual reflector chips on a device. This physical space limitation in turn limits the number of reflective electrodes that can be implemented in each reflector chip. This spatial limitation has two consequences, namely (a) not enough reflective electrodes can be implemented in each chip to generate the desired high chip reflectivity, and (b) the limited time extent of the reflector chips allows only limited apodization of weighting of reflectivity. Once again, multiple acoustic channels (or spatial diversity) can be used to completely eliminate these problems for the DFC devices of the current invention. Due to the constraints placed on OFC device design by the orthogonality conditions, the reflective chip lengths are mathematically constrained, and so spatial diversity in itself will not help OFC devices overcome this limitation. Violation of the orthogonality conditions inherent to the definition of OFC devices would be needed as well in order to overcome these drawbacks. In general, it is usually desirable to make the length of each chip long enough to achieve a sharp "brick wall" filter response in order to achieve adequate orthogonality and at the same time it is desirable to make the total code length reasonably short. These are conflicting constraints for an OFC device but not for a DFC device with spatial diversity since the time offsets between successive chips can be set independently of the chip length and can, in fact, be much smaller than a chip length.

Tapered transducer and reflector elements have been known for over 30 years in SAW devices for communication applications, and yet due to their complexity they are not widely understood or applied. To the best knowledge of the inventors, no application of tapered devices has previously been made to SAW sensor and tag devices. Tapered transducers are utilized in the present invention to efficiently spread the broadband input energy across the sensor die without losses due to power division, and to generate reflector chip responses that are discrete in the frequency domain. In order to understand the benefits provided by the use of tapered transducers and reflectors in the present invention, it is important to provide a brief description of what properties these SAW elements possess. Conventional SAW transducers and reflectors consist of interdigitated metal electrodes connected to conductive busbars of opposite polarity. The busbars are connected to an antenna, and a RF signal of the appropriate frequency that is incident on the antenna will be transmitted to the busbars as an electrical signal. The spacing and geometry of the electrodes connected to the busbars determine how this signal is converted into an acoustic wave, which then propagates along the surface of the device. The transduction effect is reciprocal, meaning that an acoustic wave incident on the transducer will be converted back into an electromagnetic wave (RF signal). Various electrode structures are recognized and used to achieve different acoustic wave responses (such as reduction in reflections internal to the transducer through the use of electrodes and spaces each $\frac{1}{8}^{th}$ wavelength wide, or use of a specified number of electrodes per wavelength to eliminate certain harmonic responses, etc.). However, all conventional SAW elements utilize electrodes that are straight (not curved) and oriented perpendicular to the busbars and parallel to the acoustic wavefront generated.

Dispersive SAW devices (such as dispersive delay lines and correlators) have varying separation between electrodes based on their location within the transducer, but all electrodes remain parallel to one another and perpendicular to the busbars. This type of structure results in an acoustic wave that has varying frequency with time, but propagates in a single acoustic path. Tapered elements are distinct from both conventional SAW elements and dispersive SAW elements. In continuously tapered elements, the orientation of the electrodes relative to one another does not remain constant across the direction transverse to the direction of the acoustic wave propagation. Rather, the electrodes gradually curve, growing closer together or farther apart from one another as one progresses across the device aperture from one busbar to the opposite busbar. The tapering may be defined by any desired mathematical relationship, from a tapering of zero (which would correspond to conventional non-tapered elements) to continuous tapering (such slanted or linearly tapered electrodes, or hyperbolically tapered electrodes), and even discrete tapering (known as step tapered elements).

The acoustic response of a tapered element produces a wave with frequency components distributed transversely across the aperture of the device. This inherently provides the type of spatial diversity advantageous to the sensor applications at hand. Broadband energy incident on a tapered transducer is efficiently spread across the entire transducer aperture—each frequency in the signal excites that portion of the transducer that has a frequency corresponding to that portion of the signal. Thus the spatial distribution of the RF energy into transverse acoustic channels is achieved, with less power division loss than would be involved if multiple broadband transducers in different acoustic tracks were electrically connected in parallel.

In addition to achieving efficient spatial diversity, since the tapering is entirely controlled by the designer, wideband filter responses are easily implemented using tapered elements, and tapered SAW elements can be used to achieve frequency responses that are nearly brick-wall filters. This feature is used in the present invention to generate reflective and/or transductive "chips" that have discrete frequency responses, for use in coding. Each chip has an almost "brick-wall" frequency response, and chips that are adjacent in the frequency domain either do not overlap at all, or overlap at acceptably low levels. The discrete nature of the chips in the frequency domain provides inherently better performance for codesets using multiple chips, due to the substantial reduction in interference between adjacent chips in the frequency domain (relative to OFC coding). So while the chips of the present invention deliberately violate the orthogonality conditions of OFC (and hence this is not in any way an OFC approach), they do in fact provide a set of chip responses that are functionally more able to operate together without interfering with one another—hence the term Discrete Frequency Coding (DFC).

Knowing the advantages provided by the use of spatial diversity and tapered SAW elements, numerous embodiments of the present invention are possible, including resonant SAW structures, delay line and differential delay line structures, coded and non-coded devices, tag devices, one-port devices, two-port devices appropriate for impedance loading of one port, and devices incorporating multiple SAW elements in one or more spatially diverse acoustic channels. Tapered SAW elements that may prove beneficial in specific embodiments include slanted, step tapered, and continuously tapered elements, including devices with a taper rate of zero, which corresponds to conventional non-tapered SAW elements. Coding techniques such as pseudo-noise (PN) coding, variants of phase shift keying (PSK), and other known coding techniques can also be implemented superimposed on DFC coding for added code set enlargement. These benefits are generally applicable to communications applications involving SAW tagging, as well as for SAW sensor tags.

The SAW devices which are examples of this invention and which can be used as sensors have certain features in common besides the use of tapered elements, i.e., tapered transducers and reflectors, and spatial diversity, i.e., the use of separate acoustic tracks for each chip or frequency element. These devices are the key components in spread spectrum sensor systems. The total bandwidth BW of the sensor system consists of the sum of the individual bandwidths of the chips the chip bandwidth $BW_c$. If there are N different frequency chips used in the sensor, then the total bandwidth BW is N times $BW_c$. In an OFC device a chip consists of a transducer (or reflector) that is defined by a certain center frequency $f_i$ and has a time duration $t_i$ (length of the element on the substrate divided by the SAW velocity). Since all of the elements are laid out in a single acoustic channel, the chips are contiguous in time and position, i.e., when one chip ends the next chip begins. There can be no overlap and there is no empty space between chips. Because of spatial diversity, the chips in DFC devices are not constrained in their length because they can overlap each other in time, and the delay offsets between different chips are likewise not constrained by any limits other than the size of the die.

In most sensor systems the measurand which indicates the quantity of interest involves a differential measurement of some kind. Sometimes there is a reference signal in the interrogator and sensing signal in the sensor in which case there is only one delay path in the sensor as shown for example in FIG. 1 or 4. In other cases there are two paths on the sensor whose difference indicates the quantity of interest. This can be achieved by a transducer in the center of the die and an element (transducer or reflector) in the same acoustic path on each side of the reflector as shown in FIG. 7. Alternatively a transducer and a single element sharing an acoustic path can be placed adjacent to a second transducer together with a single element in a second acoustic path. The two transducers are electrically connected in parallel. The two paths will differ in some respect e.g., different path length or some difference in the propagation region that allows them to act differentially. Coding may be imposed on the device by placing different time delays in each of the acoustic channel, each of which has its own characteristic frequency.

If two tracks exist on the same die the codes will be the same for each track. In this way if the two signals are correlated in the interrogator their codes will correlate identically and only the differences in the propagation paths will show up in the interrogator. In addition, specific sensors may use coating of various regions with difference selective coatings to create sensors that utilize spatial diversity along with frequency diversity to accomplish detection or measurement of multiple specific measurands.

All of these embodiments and others that would be evident to one skilled in the art are within the scope of the present invention.

BRIEF DESCRIPTION OF THE FIGURES

Other objects and advantages of the invention will become apparent from a study of the following specification when viewed in the light of the accompanying drawing, in which.

DETAILED DESCRIPTION OF THE DRAWINGS

Figure 1:
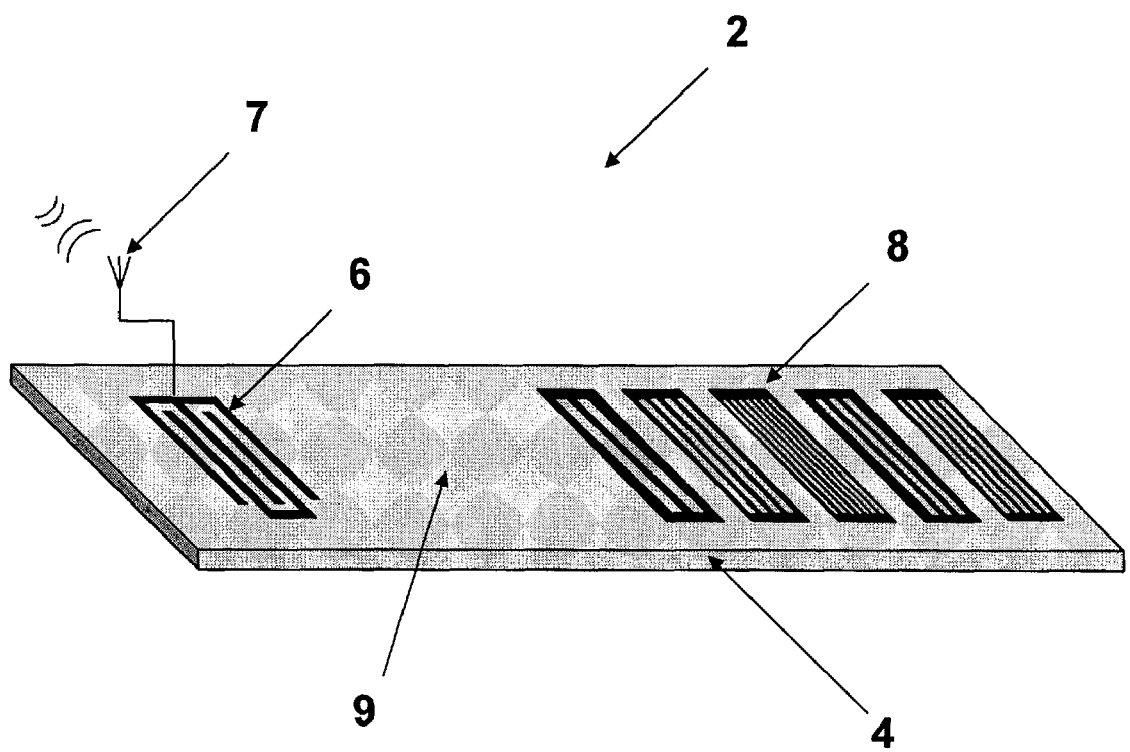
FIG. 1 is a top view of a conventional OFC reflective delay line sensor according to the prior art.

Referring first to FIG. 1, there is shown therein an orthogonal frequency coded (OFC) surface acoustic wave (SAW) device 2 according to the prior art. The device includes a piezoelectric substrate 4 on which are mounted a SAW transducers 6 and a bank of SAW reflectors 8. The transducer 6 has interdigital electrode fingers connected to one another by busbars and one of the busbars is connected to an antenna 7 as an input and output means. An input signal is received at the input via the antenna 7. The transducer 6 converts electrical signals to acoustic waves and launches the acoustic waves over a broadband frequency range towards the reflectors 8. The acoustic waves travel as surface acoustic waves along an acoustic track 9, also termed an acoustic channel, to the reflectors 8. The acoustic track 9, the transducer 6 and the reflectors 8 are all aligned along a single axis. In this example, the reflector bank 8 consists of five reflector sections, all on the axis but each at a different distance from the transducer 6 and each with a different center frequency. The round trip time delay of the surface acoustic waves from the transducer 6 to each reflective section of the reflectors 8 and back to the transducer 6 is different. The order in which specific delay times are assigned to the reflective array sections establishes a code in the reflected response. The reflected response may be detected at the output, as indicated by the antenna.

Figure 2:
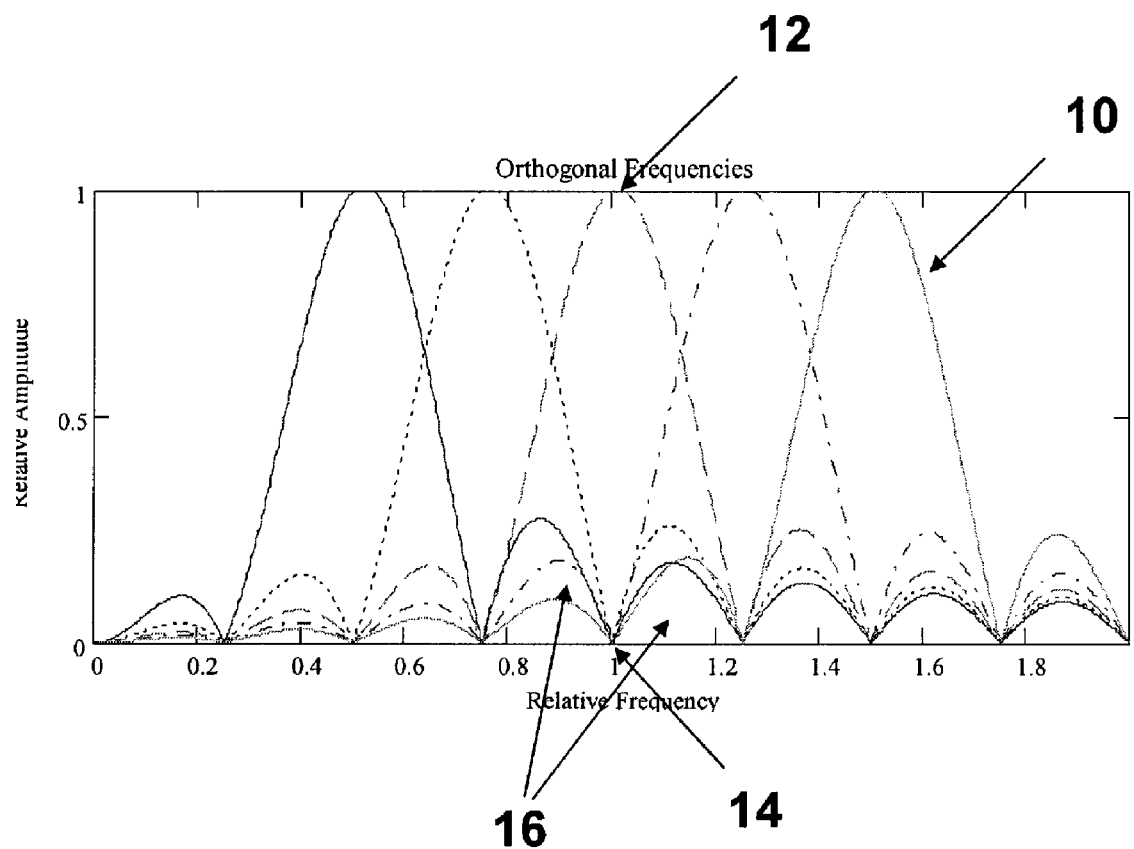
FIG. 2 is a graphical representation of the idealized frequency spectrum of the reflections from one of the reflector arrays of the prior art sensor of FIG. 1.

A graphical representation of the idealized frequency spectrum 10 (frequency response $S_{11}$) of the reflections from the reflective array 8 of an OFC SAW device according to the prior art is shown FIG. 2. The relative frequency of the signal is shown on the horizontal axis and the relative amplitude of the signal is shown on the vertical axis of the graph. The graph shows signals reaching an idealized value of one and centered on an idealized frequency of one. Of course, this may be applied an any number of frequency amplitudes and ranges. Note the five responses (the five peaks) from the five reflective sections, each with different center frequencies and a defined relationship between the nulls and peaks of adjacent reflector sections. Prior art OFC SAW devices, by definition, have the peaks of each reflector or chip frequency response 12 at the first null of the chips that are adjacent in frequency on each side 14. This results in significant spectral overlap, with the side lobes from at least the two reflectors or chips on each side injecting energy within the spectrum of the chip in question 16. This spectral overlap causes codes composed of these chips, which are orthogonal in the time domain, to suffer from significant spectral interference, rendering them functionally non-orthogonal (i.e. codes cannot be differentiated from one another in a multi-sensor environment).

Figure 3:
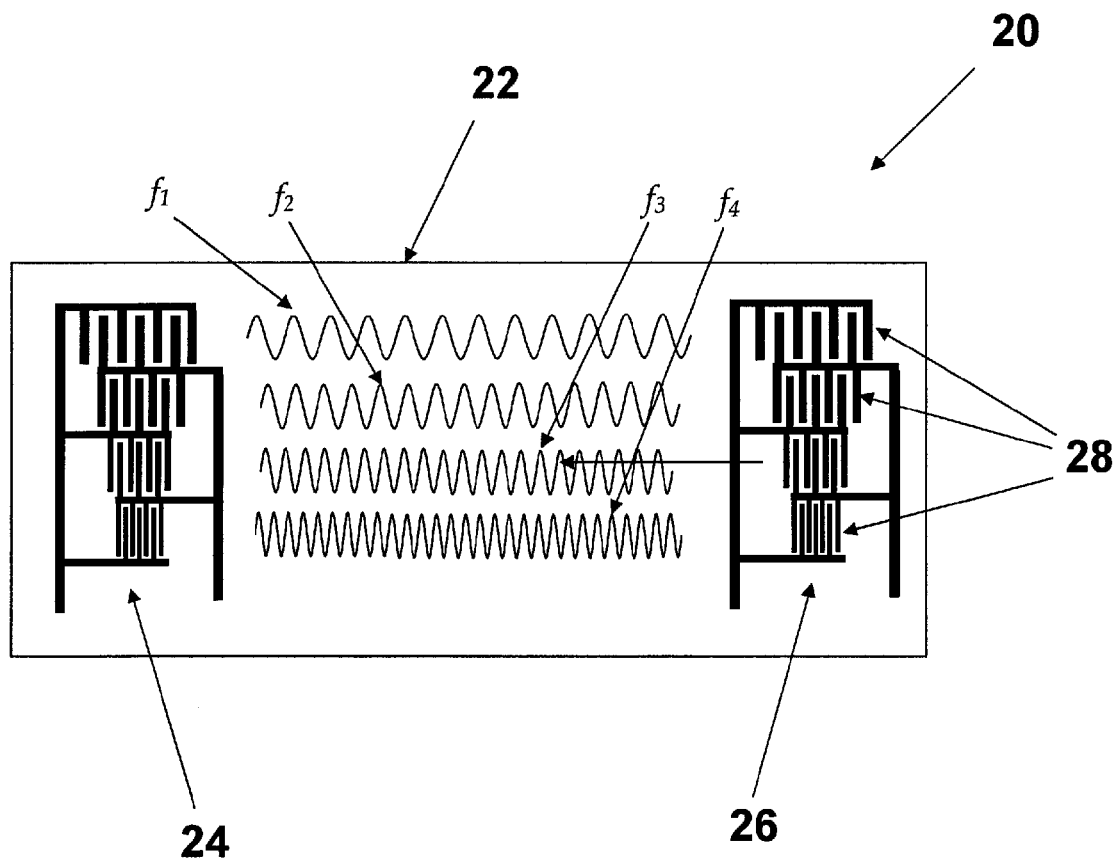
FIG. 3 is a schematic representation of a stepped tapered transducer delay line device in which all frequency components experience equal delay according to the prior art.

Referring next to FIG. 3, there is shown therein a stepped tapered transducer SAW delay line device 20 according to the prior art in which all frequency components experience an equal delay. The device includes a piezoelectric substrate 22 on which are mounted stepped SAW transducers 24 and 26. The stepped transducer 24 launches acoustic waves along an acoustic track over a broadband frequency range towards the stepped transducer 26. Each transducer is constructed in a stepped tapered fashion, with discrete sub-transducers 28 that are spatially distributed across the overall acoustic aperture of the device. In this example, the transducers 24 and 26 are shown with four sub-transducer sections 28 transverse to the acoustic wave propagation, each with a different center frequency ($f_1$, $f_2$, $f_3$, and $f_4$). The physical centers of each of the sub-transducer sections 28 lie along a line transverse to the wave propagation direction so that each sub-transducer section 28 of a transducer is the same acoustic distance from its counterpart sub-transducer section 28 of the other transducer. These sections define four acoustic channels or tracks between the respective sub-transducer sections 28. The wave generated in each acoustic channel is defined by the electrode spacing and structure within the sub-transducer 28 in that track. A wideband excitation will simultaneously excite all of the sub-transducers 26, causing a wave to propagate in each acoustic channel. The acoustic time delay from the transducer 24 to the sub-transducer 26 is equal for all acoustic channels, as a result of the equal length of the acoustic tracks from sub-transducer center to sub-transducer center. It should be noted that a similar delay line function can be implemented as a one-port device using a single stepped tapered transducer 24 and having the transducer element 26 implemented as a stepped tapered reflector. In that case, the device delay would be equal to the round trip delay of the acoustic wave from transducer 24 to the reflector 26 and back.

Figure 4:
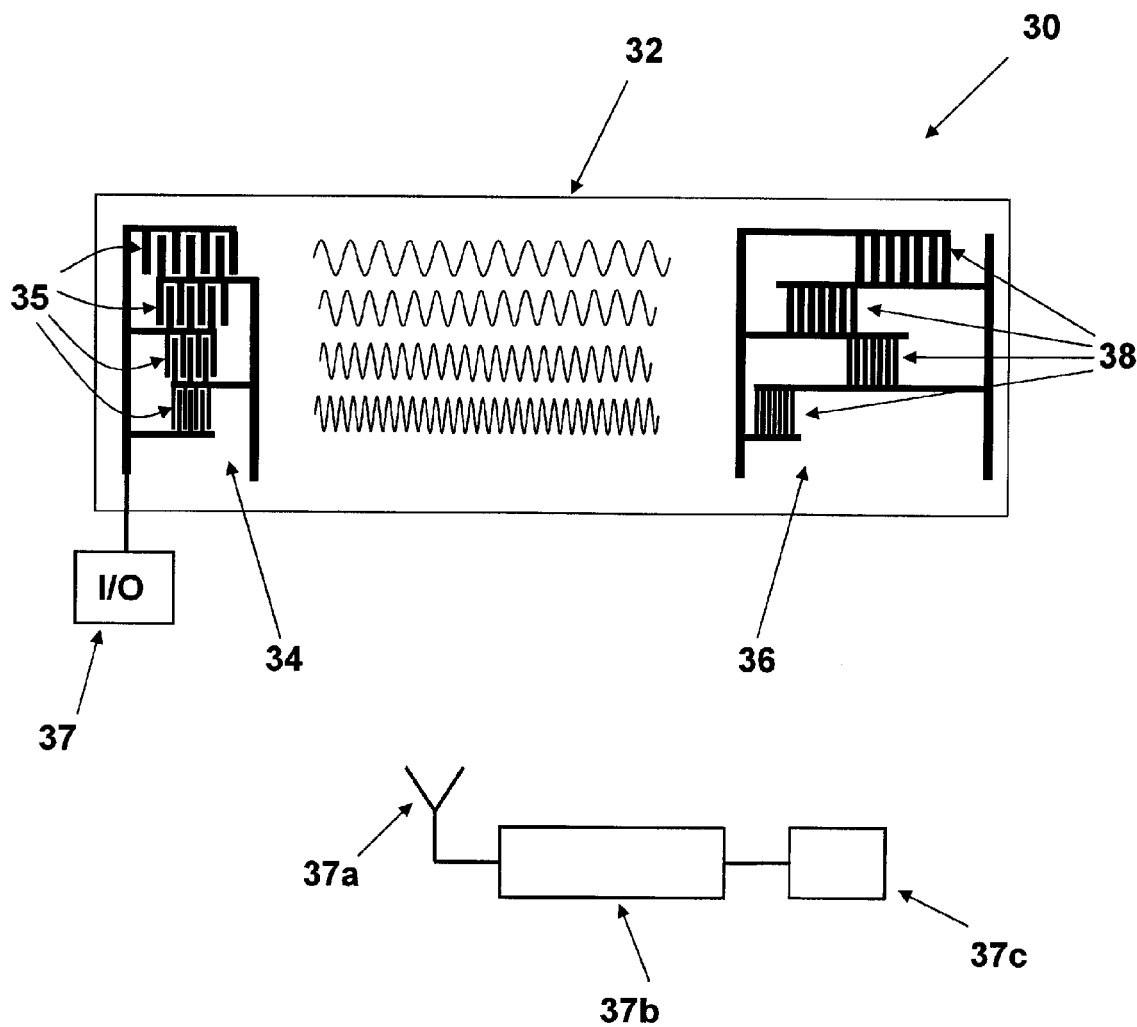
FIG. 4 is a schematic representation of top view of a stepped tapered DFC SAW delay line according to the principles of the invention.

Referring next to FIG. 4, there is shown therein a stepped tapered discrete frequency coded (DFC) SAW device 30 according to the principles of the present invention. The device includes a piezoelectric substrate 32 on which are mounted a stepped tapered SAW transducer 34 and a stepped tapered SAW reflector 36. The transducer 34 is constructed much like the transducer 24 shown in FIG. 3. The transducer 34 is connected to an input/output device 37, which may be an antenna, electrical interface, or signal processing system, for example. The transducer 34 launches acoustic waves over a broadband frequency range towards the reflector 36. Each transducer and reflector element is constructed in a stepped tapered fashion, with discrete frequency sub-transducers 35 in the transducer 34 and discrete frequency sub-reflectors 38 in the reflector 36 spatially distributed across the overall acoustic aperture of the device. In this example, the transducers are again shown with four sections disposed adjacent one another transverse to the acoustic wave propagation, each with a different center frequency. These sections 35 and 38 define four acoustic channels, although other numbers of acoustic channels may of course be provided by providing more or fewer sub-transducer sections. The present apparatus differs from the device of FIG. 3 by the fact that the acoustic tracks or channels are of different lengths for each sub-transducer section. The sub-transducer sections 38 of the reflector 36 are connected to one another by busbars with connections shared between adjacent sections, although separate connections may be provided in an alternate embodiment.

The surface acoustic wave generated in each acoustic channel is defined by the electrode spacing and structure within the sub-transducer in that track. A wideband excitation will simultaneously excite all sub-transducers, causing a wave to propagate in each acoustic channel. The round trip acoustic time delay from the transducer 34 to each reflective section of the transducer 36 and back is different for each acoustic channel as a result of its different length. The order in which specific delay times are assigned to the reflective array sections establishes a code in the reflected response.

The spatial diversity of this structure introduces substantially more freedom in the design process than is existent in OFC device design according to the prior art. Individual reflector sections, or "chips" are no longer constrained to be short, defined time lengths. Since each chip occupies its own acoustic channel, it can be of almost arbitrarily long time extent. This allows the designer to utilize many more reflective electrodes, increasing the overall reflection efficiency for the chip, and reducing insertion loss. Since the acoustic channels are narrowband, this increased chip time length does not degrade the channel bandwidth. Also, methods that are well known in the art for sculpting the passband response of each channel can be used. Conventional apodization, withdrawal weighting, sub-transducer or block weighting, and other known methods can be applied to generate chip responses that are as close to "brick wall" filter responses in the frequency domain as desired. This substantially reduces or eliminates inter-chip interference, allowing codes to work together in a manner that is functionally more orthogonal in the frequency domain than prior art devices.

An additional degree of freedom is provided by using a structure that spatially distributes the chips transversely across the die. Specifically, in the present invention, the chips can be located with time delays that are arbitrarily determined, unlike OFC devices according to the prior art, which are constrained to have specific time relationships to one another by their physical layout in a single acoustic track. These added degrees of freedom available to the device designer in the present invention make DFC SAW devices much more flexible in design, and capable of enhanced performance over the prior art.

In embodiments where the input/output element 37 is an antenna, a corresponding antenna 37a is provided on an interrogation device 37b that is powered by a power supply or battery 37c. Alternately, the input/output element 37 can be directly connected to the interrogation device 37b.

Figure 5:
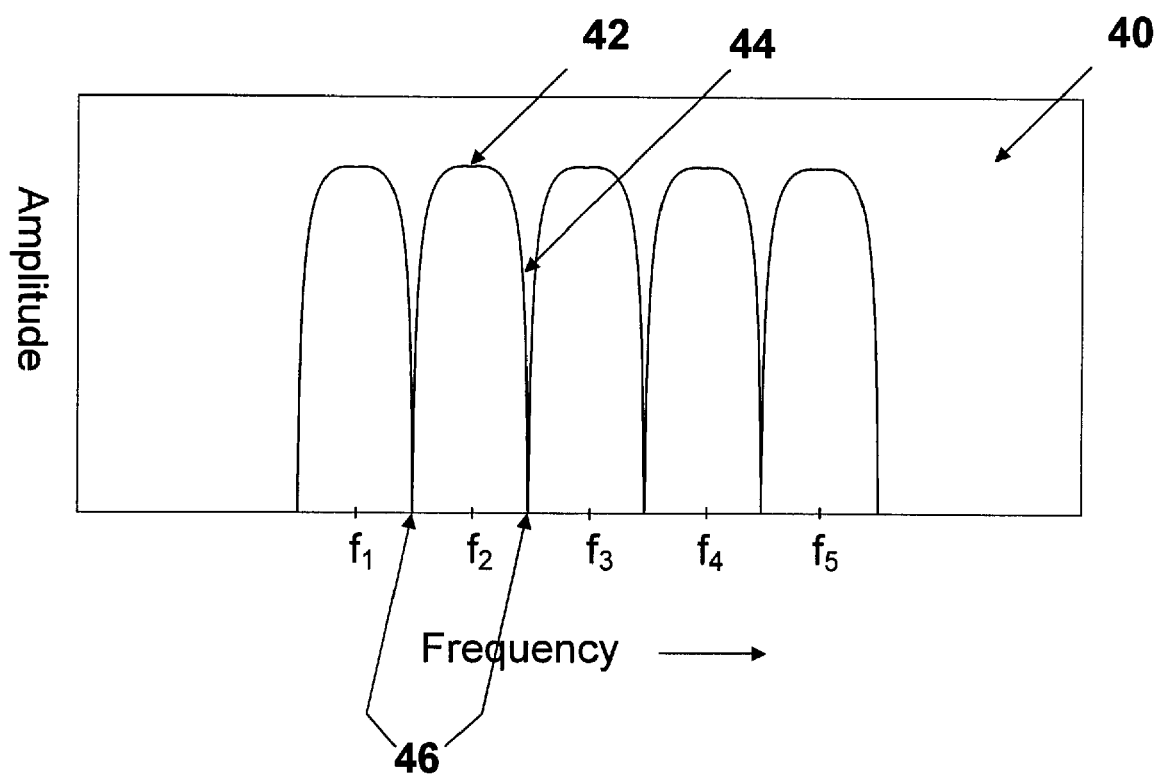
FIG. 5 is a graphical representation of the idealized frequency spectrum of the reflections from the reflector array of a DFC SAW delay line according to the invention.

FIG. 5 shows a graphical representation of the idealized frequency spectrum 40 (frequency response $S_{11}$) of the reflections from the reflective array 36 of a DFC SAW delay line device according to the invention. Note the five responses from the five reflective sections, each with different center frequencies. Unlike prior art OFC SAW devices, the individual chip frequency responses are designed to be steep and fairly flat over the passband. Each chip frequency response 42 rolls off with steep skirts or sides 44, such that the chip frequency response 42 has fallen off substantially at the first null of the chips that are adjacent in frequency on each side 46. Such a design approach minimizes the amount of inter-chip interference by effectively eliminating side lobe interactions, i.e. no (or very little) energy from the side lobes on one chip occurs in the spectral passband of another chip. While the chip passbands shown in FIG. 5 are somewhat rounded, the passband shape can be controlled by the designer to produce as flat a passband and as steep skirts as desired. The individual chip frequencies can be separated as far as necessary to reduce or eliminate interchip interference. Use of discrete frequency bands as a basis on which to build a spatially distributed (multi-channel) acoustic device means that the chips are nearly mutually orthogonal, i.e., the response of any chip will not be detected by the transducer of any other chip and significantly, this allows realization of codes composed of these chips which are functionally orthogonal (i.e. codes can be differentiated from one another in a multi-sensor environment). This is a substantial improvement over prior art OFC devices, in which the orthogonality conditions result in chip frequency responses that overlap and interfere with one another significantly.

Figure 6:
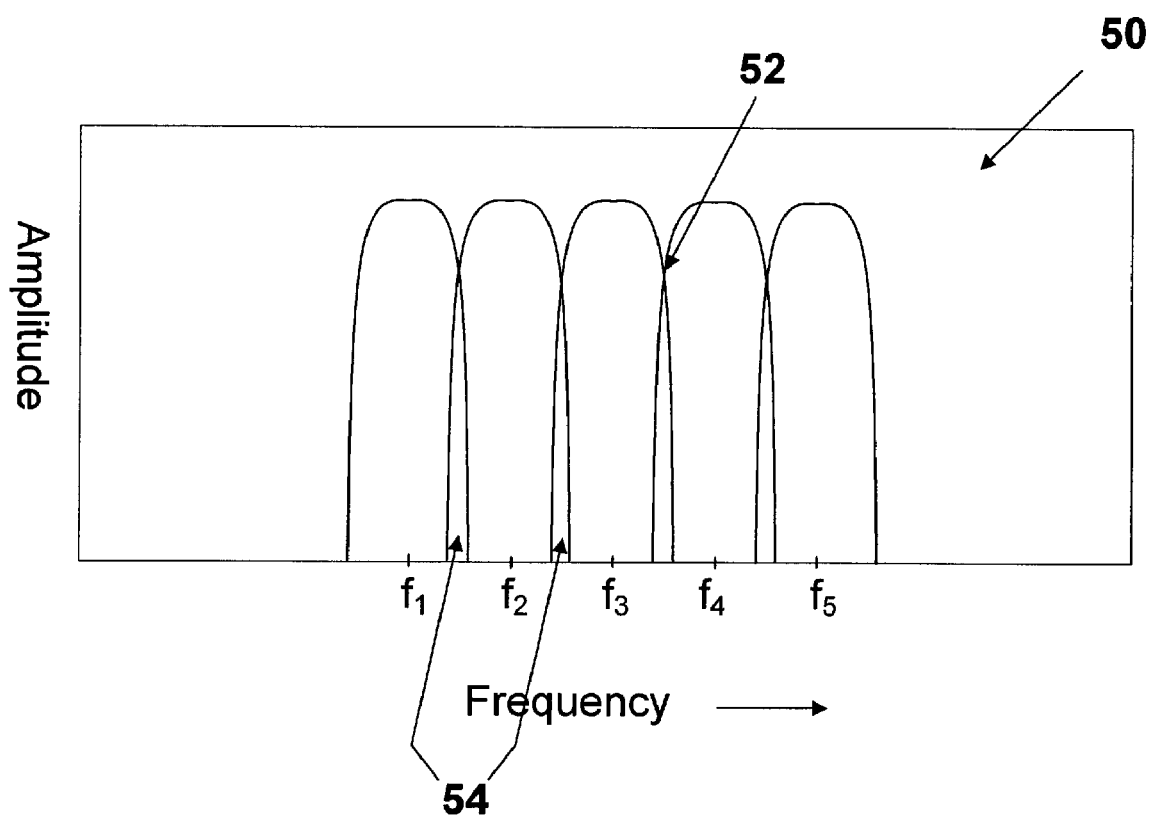
FIG. 6 is a graphical representation of the idealized frequency spectrum of the reflections from the reflector array of another possible DFC SAW delay line embodiment according to the invention.

FIG. 6 shows a graphical representation of the idealized frequency spectrum 50 (frequency response $S_{11}$) of the reflections from the reflective array 36 of a DFC SAW delay line device according to an alternate embodiment of the invention. Note the five responses from the five reflective sections are still evident. In this embodiment, however, the reflective sections have been designed so that their frequency responses cross at an arbitrarily selected amplitude level, such as the 6 dB point 52. Such a design approach substantially reduces the amount of inter-chip interference over the prior art, as evidenced by the small spectral overlap areas 54, while maintaining spectral energy efficiency by avoiding gaps in the overall device passband.

Figure 7:
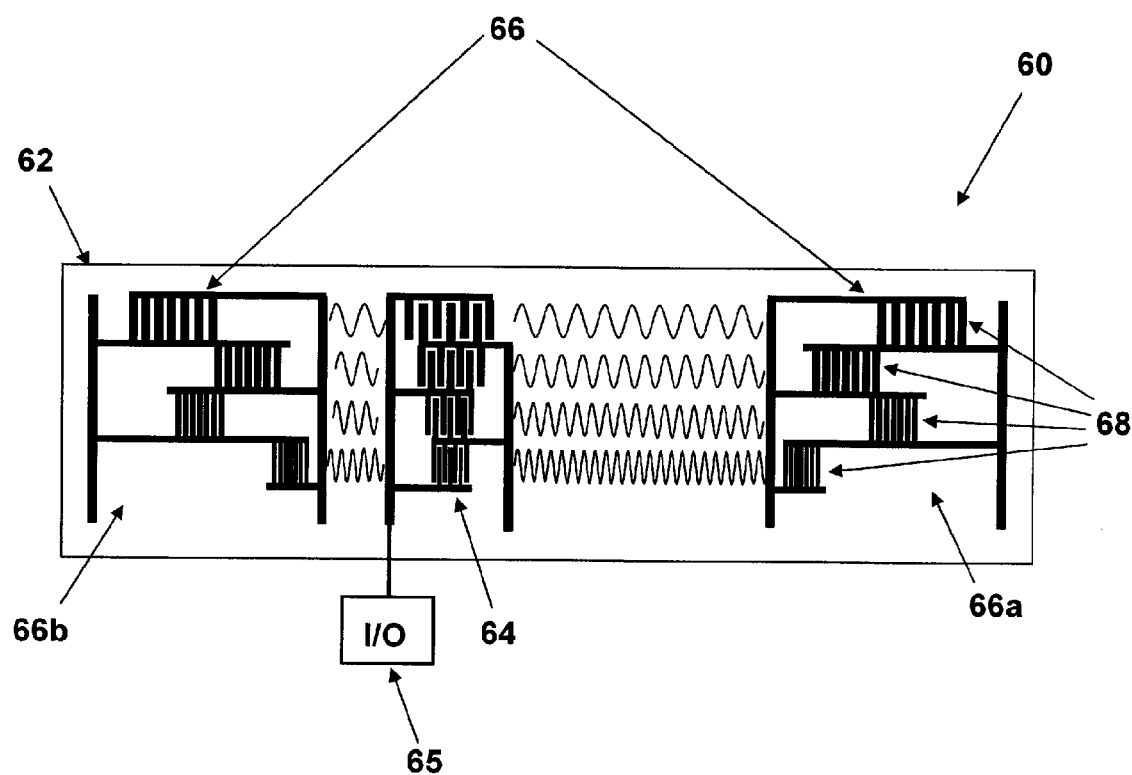
FIG. 7 is a schematic representation of top view of a stepped tapered DFC SAW differential delay line with coding in the outer reflectors according to the invention.

Referring next to FIG. 7, there is shown therein a stepped tapered discrete frequency coded (DFC) differential delay line SAW device 60 according to another embodiment of the present invention. The device includes a piezoelectric substrate 62 on which are mounted a stepped tapered SAW transducer 64 and two stepped tapered SAW reflectors 66. The transducer 64 is connected to an input/output device 65, such as described above. The reflectors 66 are mirror images of one another, and are spaced different distances away from transducer 64. The transducer 64 has its sub-transducer sections aligned with one another along the transverse to the wave propagation direction, but the reflectors 66 have their sub-transducer sections out of alignment with one another relative to the transverse of the propagation direction so that the physical center if each section is at a different distance from the transducer 64. It is also foreseen that two or more of the sections could be aligned with one another while others of the sections are out of alignment relative to one another with reference to the transverse to the wave propagation direction.

The transducer 64 launches acoustic waves over a broadband frequency range towards reflectors 66. Each transducer and reflector element is constructed in a stepped tapered fashion, with discrete sub-transducers or sub-reflectors 68 spatially distributed across the overall acoustic aperture of the device. In this example, the transducer is again shown with four sections transverse to the acoustic wave propagation, each with a different center frequency. These sections define acoustic channels. The wave generated in each acoustic channel is defined by the electrode spacing and structure within the sub-transducer in that track. A wideband excitation will simultaneously excite all sub-transducers, causing a wave to propagate in each acoustic channel. The round trip acoustic time delay from the transducer 64 to each reflective section of the reflector 66 and back is different for each acoustic channel. The order in which specific delay times are assigned to the reflective array sections establishes a code in the reflected response.

In a device as shown in FIG. 7, the coded response reflected back from the left reflector bank 66b will have a shorter delay than the coded response reflected back from the right reflector bank. This is due to the greater separation between the transducer 64 and the right reflector bank 66a, which results in an increased acoustic wave propagation time and hence an increased delay as compared to the separation between the transducer 64 and the left reflector 66b. Once again, in the present invention, the reflective chips can be located with time delays that are arbitrarily determined, and can have arbitrary time lengths as selected by the designer to achieve performance goals. These device parameters are not constrained by conditions of orthogonality as in prior art OFC devices. The signal propagating from the transducer 64 to the left to reflector 66b and back to the transducer 64 will add linearly to the signal propagating to the right reflector 66a and back to the transducer 64. The combined signal will be correlated in the interrogator by the matched filter response of the code of reflector, resulting in two compressed pulses in the time domain. The separation of these two pulses can be used by the interrogator to determine the quantity of interest to be sensed. This may be by actually measuring the time delay between the pulses or by using the frequency response generated by these two taps in a transversal filter.

Figure 8:
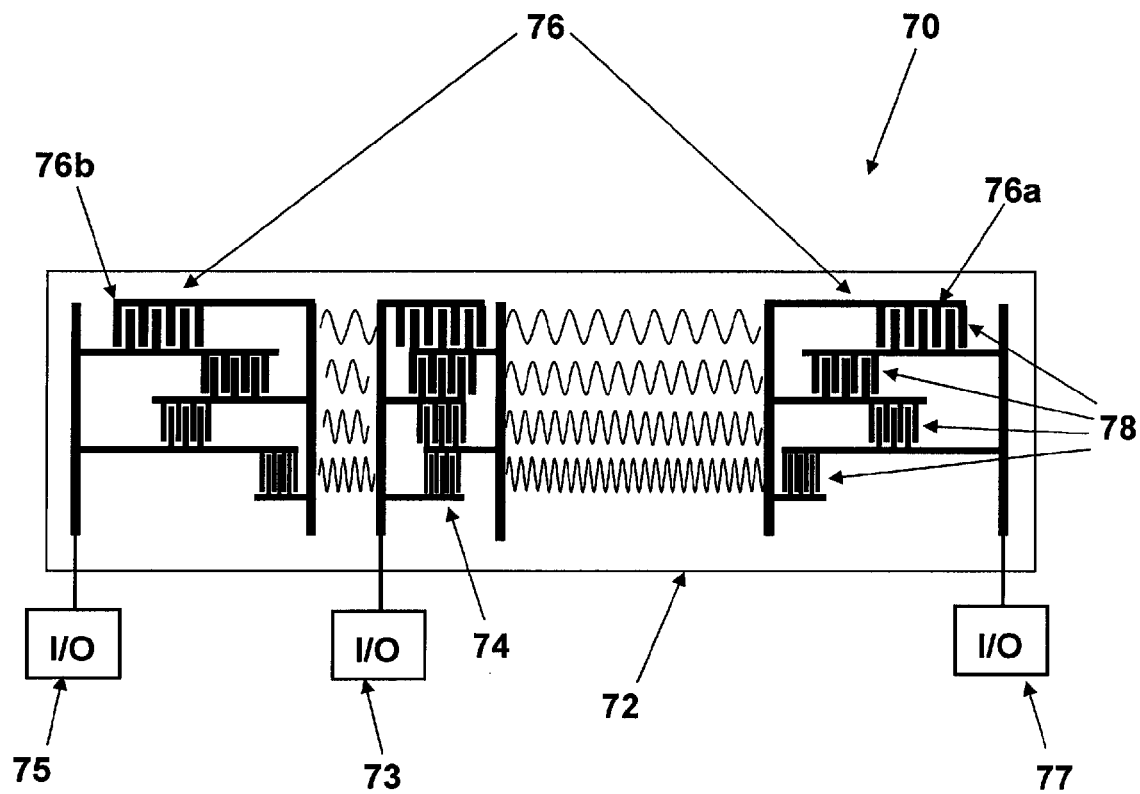
FIG. 8 is a schematic representation in plan view of an alternate embodiment of a stepped tapered DFC SAW differential delay line with coding in the outer transducers according to the invention.

FIG. 8 shows another stepped tapered discrete frequency coded (DFC) differential delay line SAW device 70 according to yet another embodiment of the present invention. The device includes a piezoelectric substrate 72 on which are mounted a stepped tapered SAW transducer 74 and two stepped tapered SAW transducers 76. The difference between this embodiment and the embodiment of FIG. 7 is that the left and right elements 76a and 76b are transducers with output connections 75 and 77 rather than reflectors which reflect the signal back to the center element as in FIG. 7. The center element 74 is connected only to an input 73. The transducers 76a and 76b are mirror images of one another, and are spaced different distances away from transducer 74. The transducer 74 launches acoustic waves over a broadband frequency range towards the transducers 76a and 76b. Each transducer element is constructed in a stepped tapered fashion, with discrete sub-transducers 78 (within the transducers 74 and 76) spatially distributed across the overall acoustic aperture of the device. In this example, the transducer is again shown with four sections transverse to the acoustic wave propagation, each with a different center frequency. These sections define acoustic channels. The wave generated in each acoustic channel is defined by the electrode spacing and structure within the sub-transducer in that track. A wideband excitation will simultaneously excite all sub-transducers, causing a wave to propagate in each acoustic channel. In this embodiment, the external transducers 76a and 76b will receive the acoustic wave after an acoustic time delay corresponding to the spacing from the transducer 74 to each sub-transducer of 76, delays that will once again be different for each acoustic channel. The order in which specific delay times are assigned to the outer transducer sub-transducer sections establishes a code in the response.

In a device as shown in FIG. 8, the coded response from the left transducer 76b will have a shorter delay than the coded response from the right transducer 76a. This is due to the greater separation between the transducer 74 and the right transducer 76a, which results in an increased acoustic wave propagation time and hence an increased delay as compared to the separation between transducer 74 and the left transducer 76b. The outer transducers 76a and 76b will convert the acoustic wave back into two radio frequency (RF) electric signals, which after being received at the outputs 75 and 77 can be measured or transmitted to a receiver.

This SAW device can be used for communication purposes or as a sensor. When used as a sensor, this device can be used in one of two ways. The three transducers can all be connected in parallel and connected to an antenna for communication to the interrogator, or the transducers 76 can be used as reflectors in which case only the transducer 74 is connected to the antenna. In the latter case the matching conditions on the transducers 76 can be used to vary the reflectivity of these transducers. They can be electrically shorted, or left open circuited, or connected to an external impedance element which is in itself a passive sensing element. This is an interesting case because the change in impedance from the external sensing element changes the reflectivity of the corresponding transducer which changes the amplitude of one pulse of the differential pair of pulses. This can be measured by an interrogator circuit, and so the SAW device is acting as a link between the passive sensor and an interrogator, while also providing the function of an RFID tag. Once again, the reflective chips can be located with time delays that are arbitrarily determined, and can have arbitrary time lengths as selected by the designer to achieve performance goals.

Figure 9:
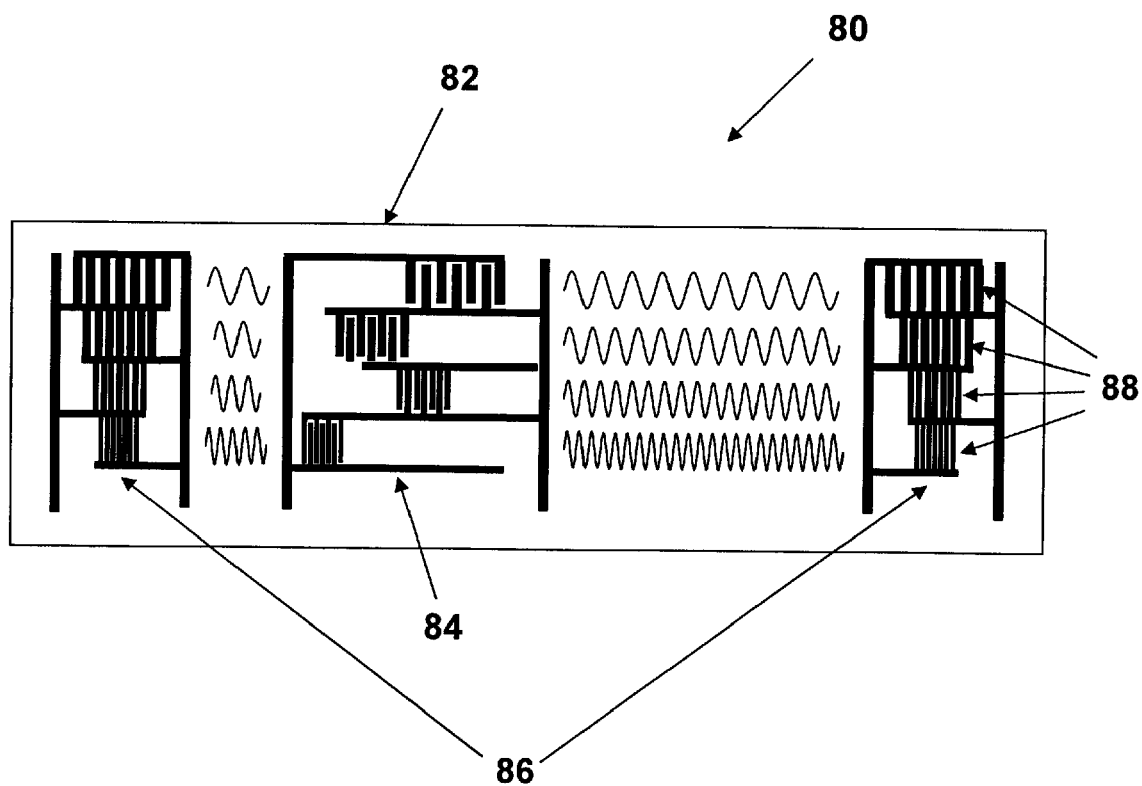
FIG. 9 is a schematic representation in plan view of yet another alternate embodiment of a stepped tapered DFC SAW differential delay line with coding in the center transducer according to the invention.

FIG. 9 shows yet another stepped tapered discrete frequency coded (DFC) differential delay line SAW device 80 according to the present invention. The device includes a piezoelectric substrate 82 on which are mounted a stepped tapered SAW transducer 84 and two stepped tapered SAW reflectors 86. The reflectors 86 are composed of sub-reflectors aligned so that the centerlines of the sub-reflectors are coincident, i.e. relative to the transverse of the propagation direction. The reflectors 86 are also spaced different distances away from transducer 84. The transducer 84 launches acoustic waves over a broadband frequency range towards the reflectors 86. Each transducer and reflector element is constructed in a stepped tapered fashion, with discrete sub-transducers (within the transducer 84) and sub-reflectors 88 spatially distributed across the overall acoustic aperture of the device.

In this example, the transducer is again shown with four sections transverse to the acoustic wave propagation, each with a different center frequency. These sections define acoustic channels. The wave generated in each acoustic channel is defined by the electrode spacing and structure within the sub-transducer in that track. A wideband excitation will simultaneously excite all sub-transducers, causing a wave to propagate in each acoustic channel. In this embodiment, the sub-transducers of the transducer 84 are distributed such that the acoustic wave launched in each channel will experience a different delay when propagating to one of the reflectors and back to the transducer 84, where the wave will be transduced back into an RF signal. This once again implements a code.

It should be noted that in this embodiment, the coded signal contained in the reflected response from the wave that reflects off of the rightmost reflector bank will be a time delayed, time reversed version of the coded signal contained in the wave reflecting off of the leftmost reflector bank. Availability of both a coded signal and its time reversal can be useful in certain applications. It should be evident that this functionality can also be achieved using another embodiment that has transducers in place of the reflectors 86. As before, the transducers and/or reflectors are connected to input and/or output devices or circuits.

Figure 10:
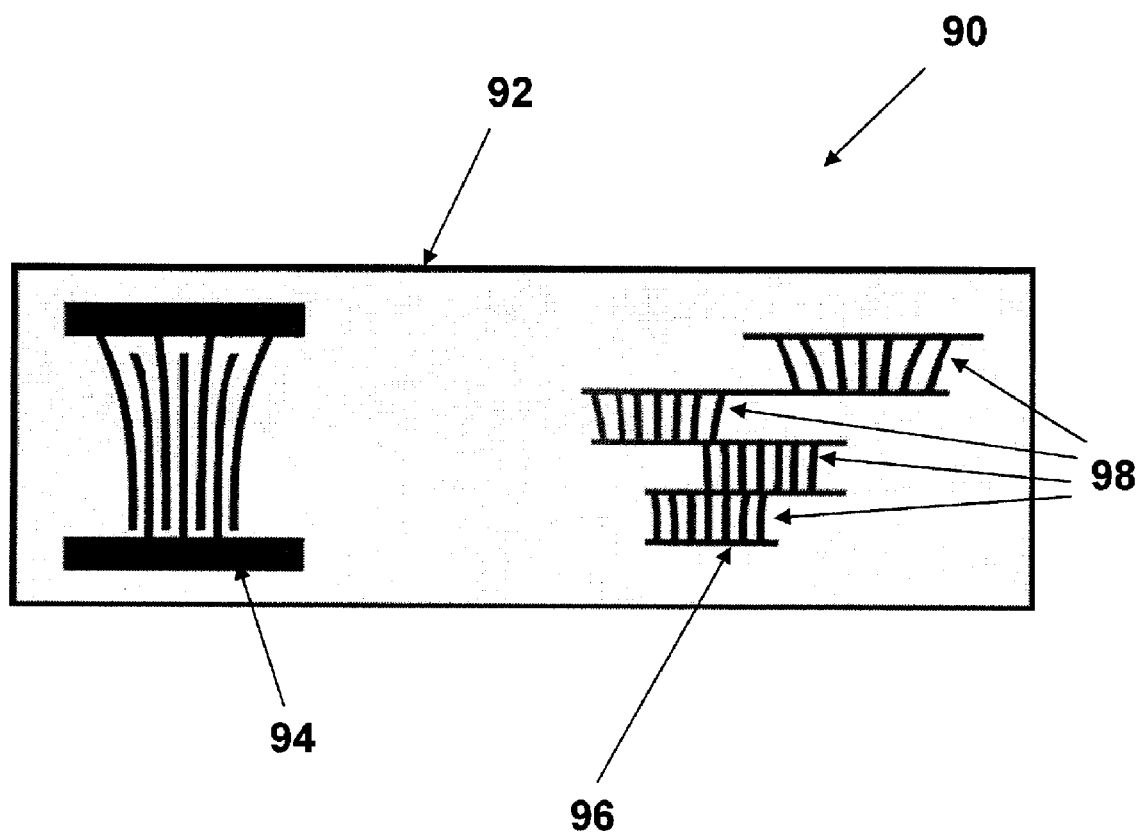
FIG. 10 is a schematic representation in plan view of a continuously tapered DFC SAW delay line with coding in the reflectors according to the invention.
Figure 11:
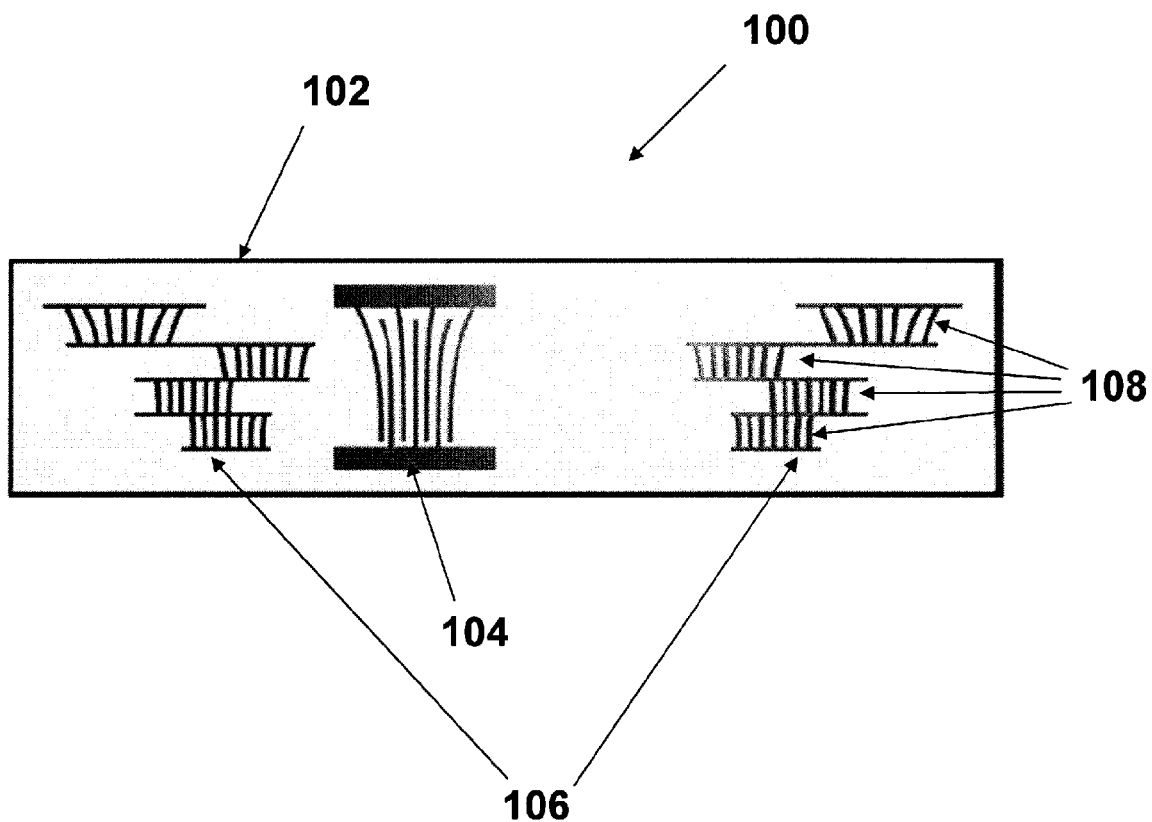
FIG. 11 is a schematic representation in plan view of a continuously tapered DFC SAW differential delay line with coding in the reflectors according to the invention.
Figure 12:
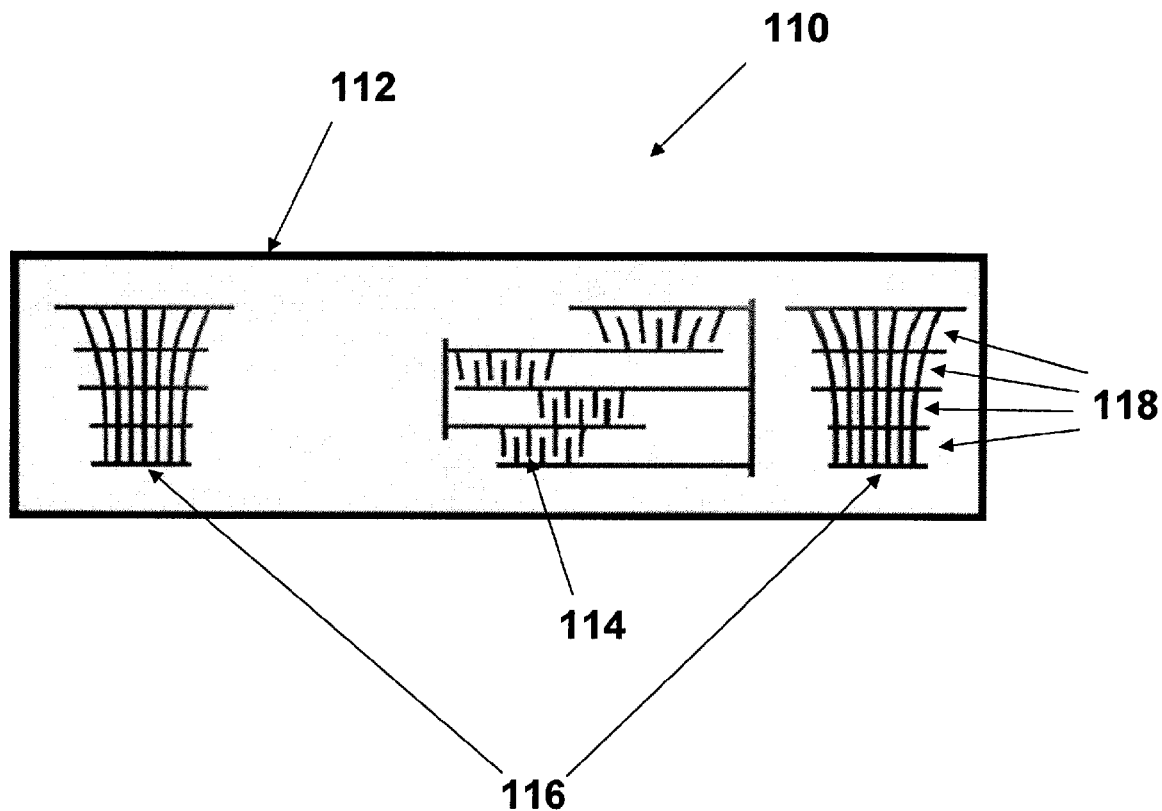
FIG. 12 is a schematic representation in plan view of an alternate embodiment of a continuously tapered DFC SAW differential delay line with coding in the transducer according to the invention.

FIGS. 4, 7, 8, and 9 all show stepped tapered implementations of the present invention. Another series of preferred embodiments use continuously tapered transducer and reflector elements. FIGS. 10, 11, and 12 show embodiments 90, 100 and 110 on respective substrates 92, 102 and 112 similar in nature to FIGS. 4, 7 and 9, respectively, but implemented using continuously tapered transducers 94, 104 and 116 rather than stepped tapered transducers. The devices with continuously tapered transducers 94, 104 and 116 are generally functionally equivalent to the step tapered devices but the use of continuously tapered transducers and/or reflector can provide greater levels of selectivity in the filtering operations of the devices.

The continuously tapered transducers 94, 104 and 116 have a more continuous frequency response than the stepped tapered transducer, both in terms of SAW generation and SAW sensing. Instead of four discrete acoustic tracks being used, a continuous acoustic track is formed between the elements and the various frequencies are carried at different positions on the track relative to the transverse of the propagation direction. In other words, instead of a stepped frequency signal, the acoustic wave is a continuous frequency acoustic wave when viewed across the transverse to the propagation direction. Input and output devices are connected to the transducers/reflectors as described above.

The illustrated SAW devices have one transducer or reflector 96, 106 and 114 with the subsections 98 and 108 out of alignment with respect to one another at the transverse to the propagation direction and the other transducer or reflector 94, 104 and 116 with the subsections for example, 118, in alignment with respect to one another along the transverse to the propagation direction. It is possible to exchange these for one another or to have both SAW elements of an acoustic track with the subsections out of alignment. In embodiments with three transducer and/or reflector elements, it is foreseeable that all three would have the subsections out of alignment relative to on another along the transverse.

Other embodiments that utilize discrete frequency coding on SAW devices for communication and sensor applications are within the scope of this invention, including but not limited to the use of selective coatings to realize chemical sensors and biological sensors, both for vapor and liquid phase, and different device configurations and mounting techniques to effect physical sensors for temperature, pressure, strain, torque, and liquid measurements (viscosity, flow rate, etc.). It would be understood by one skilled in the art that the advantages of the present invention can be realized in devices made using various acoustic wave modes, including but not limited to Rayleigh waves, flexural plate waves, acoustic plate modes, transverse waves, and guided waves such as Love waves, Lamb waves, and layer guided waves. Similarly, any of a wide range of interrogation system architectures can be used to interrogate such devices. Additional aspects of a practical system utilizing the invention include the ability to store data and calculation results, and devices for transmitting the data and/or results to entities interested in the results. Such transmission of information may include but is not limited to communicating to external computers, web sites, cell phones, and other devices.

It is within the scope of the present invention that the input element(s) and/or output element(s) may include interrogation devices, control circuits, sensor circuits, display device, or any number of other well known devices or systems such as can be connected to a surface acoustic wave device. One application of the present device is as a sensor wherein the device is configured or constructed in a know way so that a parameter to be measured affects the acoustic wave propagation within the device and/or affects an electrical impedance of an external device connected to the surface acoustic wave device.

Although other modifications and changes may be suggested by those skilled in the art, it is the intention of the inventors to embody within the patent warranted hereon all changes and modifications as reasonably and properly come within the scope of their contribution to the art.

What is claimed is:

1. A sensor, comprising:
 a coded finite impulse response surface acoustic wave device, including:
 (a) a piezoelectric substrate;
 (b) at least one first transducer arranged on at least a portion of said piezoelectric substrate wherein said at least one first transducer has electrode structures that vary in width and separation so as to generate and receive acoustic waves in spatially adjacent acoustic tracks at frequencies that vary laterally across a transducer acoustic aperture of said at least one first transducer in a direction perpendicular to a direction of acoustic wave propagation, said at least one first transducer having first transducer sub-elements each having a physical center, said physical centers of said first transducer sub-elements being aligned along a common center line;
 (c) at least one second surface acoustic wave element on said piezoelectric substrate and spaced from said at least one first transducer along the direction of acoustic wave propagation, said at least one second surface acoustic wave element comprising sub-elements, said sub-elements each comprises electrode structures that are operable to interact with acoustic waves at frequencies that correspond to a subset of the frequencies generated by said at least one first transducer, said sub-elements of said at least one second surface acoustic wave element each having a physical center; and
 (d) wherein the at least one second surface acoustic wave element is structured such that said sub-elements of said second surface acoustic wave element are spatially distributed laterally across the acoustic aperture to receive the lateral spatial distribution of frequencies from said first transducer, said physical centers of said sub-elements of said at least one second surface acoustic wave element being spaced at different center to center positions in the direction of acoustic wave propagation relative to said common center line of said first transducer, so as to effect different delays within each of said acoustic tracks, thereby effecting a code, wherein a parameter to be measured affects the acoustic wave propagation within said device.

2. A coded surface acoustic wave device, comprising:

a finite impulse response device including:

(a) a piezoelectric substrate;

(b) at least one first transducer on at least a portion of said piezoelectric substrate wherein said first transducer has electrode structures that vary in width and separation so as to generate and receive acoustic waves in spatially adjacent acoustic tracks at frequencies that vary laterally across an transducer acoustic aperture of said at least one first transducer in a direction perpendicular to a direction of acoustic wave propagation, said at least one first transducer having a physical center line extending laterally across the transducer acoustic aperture;

(c) at least one second surface acoustic wave element on said piezoelectric substrate and spaced from said at least one first transducer along the direction of acoustic wave propagation, said at least one second surface acoustic wave element comprising sub-elements, each of said sub-elements comprises electrode structures that are operable to interact with acoustic waves at frequencies that correspond to a subset of the frequencies generated by said at least one first transducer, said sub-elements each having a physical center;

(d) wherein said sub-elements of said at least one second surface acoustic wave element are spatially distributed laterally across the acoustic aperture to match the lateral spatial distribution of frequencies in said first transducer; and (e) wherein said at least one second surface acoustic wave element is structured such that said sub-elements of said second surface acoustic wave element are spaced at different center-to-center positions in the direction of acoustic wave propagation relative to the center line of the corresponding portion of said first transducer, so as to effect different delays within each of said acoustic tracks, thereby effecting a code.

3. A coded surface acoustic wave device as defined in claim 2, wherein said at least one second surface acoustic wave element comprises a transducer made up of electrically connected sub-transducers.

4. A coded surface acoustic wave device as defined in claim 2, wherein said at least one second surface acoustic wave element comprises a reflector made up of sub-reflectors.

5. A coded surface acoustic wave device as defined in claim 2, wherein said at least one second surface acoustic wave element comprises at least two second surface acoustic wave elements connected with said piezoelectric substrate spaced from said at least one first transducer.

6. A coded surface acoustic wave device as defined in claim 5, wherein said at least two second surface acoustic wave elements are mirror images of one another and are located on opposite sides of said at least one first transducer.

7. A coded surface acoustic wave device as defined in claim 5, wherein the said at least one first transducer comprises at least two electrically connected transducers spaced in different acoustic tracks, and wherein said at least two second surface acoustic wave elements are spaced from and located on at least one side of said first transducers.

8. A coded surface acoustic wave device as defined in claim 2, wherein said electrode structures of said first transducer and said electrode structures of at least one of said sub-elements of said at least one second surface acoustic wave elements include parallel electrodes.

9. A coded surface acoustic wave device as defined in claim 2, wherein said electrode structures of said first transducer and said electrode structures of at least one of said sub-elements of said at least one second surface acoustic wave elements include continuously tapered electrodes.

10. A coded surface acoustic wave device as defined in claim 2, wherein said at least one second surface acoustic wave element includes busbars, and further comprising:

an external sensing element electrically connected to at least a subset of said busbars of said at least one second surface acoustic wave element.

11. A sensor, comprising:

a coded surface acoustic wave device as defined in claim 10, wherein the parameter to be measured affects the electrical impedance of said external sensing element, thereby altering the performance of said device.

* * * * *